United States Patent [19]

Buck

[11] Patent Number: 5,367,136
[45] Date of Patent: Nov. 22, 1994

[54] NON-CONTACT TWO POSITION MICROELETRONIC CANTILEVER SWITCH

[75] Inventor: Daniel C. Buck, Hanover, Md.

[73] Assignee: Westinghouse Electric Corp., Pittsburgh, Pa.

[21] Appl. No.: 96,237

[22] Filed: Jul. 26, 1993

[51] Int. Cl.$^5$ .......................................... H03K 17/975
[52] U.S. Cl. ................................. 200/600; 200/181
[58] Field of Search ............................... 200/600, 181

[56] References Cited

U.S. PATENT DOCUMENTS

| | | | |
|---|---|---|---|
| 3,539,705 | 11/1970 | Nathanson et al. | 174/254 |
| 3,681,134 | 8/1972 | Nathanson et al. | 437/134 |
| 3,796,976 | 3/1974 | Heng et al. | 333/161 |
| 4,922,253 | 5/1990 | Nathanson et al. | 342/5 |
| 5,258,591 | 11/1993 | Buck | 200/181 |
| 5,268,696 | 12/1993 | Buck et al. | 342/372 |

*Primary Examiner*—J. R. Scott
*Attorney, Agent, or Firm*—Christopher O. Edwards

[57] ABSTRACT

A microelectrostatic cantilever switch that has a thin impermeable oxide layer on the surface of a contact pad which is engaged by an unsupported portion of a cantilever beam when the switch is in a closed position. The switch in the open position exhibits a capacitance between the cantilever beam and contact pad of 0.8 Pf and a capacitance of 0.001 to 0.01 Pf in the closed position.

9 Claims, 1 Drawing Sheet

NON-CONTACT TWO POSITION MICROELETRONIC CANTILEVER SWITCH

BACKGROUND OF THE INVENTION

1. Field of Invention

The present invention relates to microelectronics; and more particularly, to a microelectrostatic voltage controlled cantilever switch.

2. Discussion of Related Art

Microelectrostatic voltage controlled switches are used to conduct RF current in applications that involve the of antenna phase shifters, and RF shutters for the protection of radar arrays, for example. Typically these switches comprise a conductive cantilevered beam mounted on a silicon substrate wherein the cantilevered beam has an unsupported portion or free end that overhangs a contact pad. When in an open position, the free end of the cantilevered beam is spaced from the gold contact pad. In response to a DC pull-down voltage applied to the pull down electrode, the substrate coulomb forces cause the free end of the cantilevered beam to engage the surface of the contact pad, thus, resulting in the flow of current from the cantilevered beam to the contact pad.

It has been found that these switches are capable of conducting RF current through approximately ten million switching cycles without failure. After operating in excess of the approximately ten million cycles, the free end of the cantilevered beam tends to stick to the contact pad, which at best decreases the opening speed of the switch, and at the worst causes the switch to remain in its closed position.

Although ten million switching cycles without failure is acceptable for many switching applications, this failure is unacceptable for uses where reliability is paramount over periods of time, such as applications in outer space, for example.

In light of the foregoing, there is a need for microelectrostatic voltage controlled switches that are able to be manufactured at a cost commensurate with and operate effectively as those heretofore developed, but which are also without failure for a substantially greater number of switching cycles.

SUMMARY OF THE INVENTION

Accordingly, the present invention is directed to a microelectrostatic cantilever switch which substantially improves the switching cycle lifetime of the described previously developed switch.

Additional advantages of the invention will be set forth in the description which follows, and in part will be apparent from the description or may be learned by practice the invention. The specific advantages and other objects and advantages of the invention will be realized and attained by the apparatus particularly pointed out in the written description and claims hereof as well as the appended drawings.

To achieve these and other objects and advantages in accordance with the purpose of the invention, as embodied and broadly described herein, the microelectrostatic cantilever switch of the present invention comprises a substrate, a pull down electrode, a contact pad, having a planar surface, mounted to the substrate, a cantilever beam fixedly mounted at one end to the substrate and having a free end overhanging the pull down electrode and the planar surface of the contact pad, the free end of the cantilever beam having a planar surface opposing the contact pad, and the pull down electrode, an insulative layer deposited on at least one of the cantilever beam and the contact pad planar opposing surfaces, the opposing insulated surface of the contact pad being spaced from the opposing surfaces of the cantilever beam to provide an air gap therebetween when the switch is in an open position; and means for applying a voltage across the cantilever beam and the pull down electrode to pull the opposing surface of the cantilever beam toward the pull down electrode to close the air gap between the cantilever beam and the contact pad when the switch is operated to the closed position, the space between the opposing surfaces in the open position and the thickness of the insulative layer in the closed position being dimensioned to provide a capacitance in the closed position that is at least two orders of magnitude greater than the capacitance in the open position.

It is to be understood that both the foregoing general description and the following detailed description are exemplary and explanatory and are intended to provide further explanation of the invention as claimed.

The accompanying drawings, which are incorporated in and constitute a part of this specification, illustrate one embodiment of the invention and together with the description serve to explain the principles of the invention.

DETAILED DESCRIPTION

Figure 1:
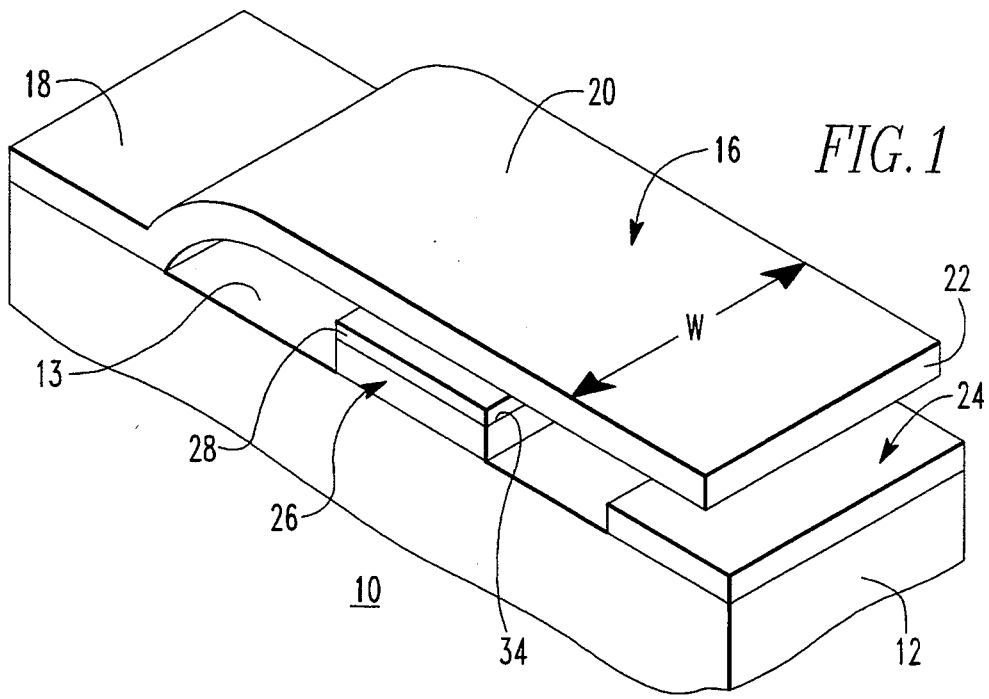
FIG. 1 is a highly magnified fragmentary view in perspective of the cantilever beam and contact pad arrangement of a microelectrostatic cantilever switch according to one embodiment of the invention.

Reference will now be made in detail to a preferred embodiment of the invention, an example of which is illustrated in the accompanying drawing. Whenever possible, the same reference numbers will be used throughout the drawings to refer to the same or like parts.

The switch of the present invention comprises a substrate. As herein embodied and referring to FIGS. 1–3, a microelectrostatic switch, generally referred to as 10, has an insulating substrate 12, which is preferably silicon, but may also be quartz, glass, teflon, or other smooth insulating electronic substrate, for example. Substrate 12 has an upper surface 13 which may be a surface of a layer of silicon oxide or a polysilicon or polysilicon nitride layer (not shown), for example.

The switch has a cantilever beam fixed at one end to the substrate and having an elongated unsupported portion overhanging the substrate, said unsupported portion terminating at a free end.

As herein embodied, a cantilever beam 16 has an end 18 fixed to surface 13 of the substrate 12 and an unsupported length 20 that extends a distance L between the fixed end 18 and a free end 22.

The switch of the present invention also includes a pull down electrode fixed to the substrate between the substrate and the cantilever beam.

As herein embodied, a pull down electrode 24 is deposited on the substrate 12 beneath a portion of the beam 16 adjacent free end 22. The switch of the present invention preferably includes a metallic contact pad fixed to the substrate between the substrate and the cantilever beam, the cantilever beam being spaced from the contact pad with the switch in the open position.

As embodied herein, between the fixed end 18 of the cantilever beam 16 and the free end 22, and spaced from the pull down electrode 24 is a contact pad 26. Contact pad 26 preferably may be of a material, such as gold, and pull down electrode 24 preferably may be made of a material, such as gold. The substrate 12 may have a ground connection 32 connected to the fixed end 18 of the cantilever beam with a voltage source 30 directly at the pull down electrode 24, for example. For a detailed description of the method of making an electrostatic switch of the type described herein, reference is made to U.S. Pat. No. 3,539,705 issued in Nov. 10, 1970.

In accordance with the invention, an impermeable oxide layer is deposited on at least one of the opposing surfaces of the free end of the cantilever beam and the contact pad.

As herein embodied, an impermeable oxide layer 28, which may be an oxide of chrome or alumina is deposited on surface 34 of the contact pad 26. The minimum thickness of the insulative layer 28 is preferably in the range of between 0.1 and 0.5 microns; i.e., at a thickness that will prevent metal to metal contact between opposing surfaces of the contact pad 26 and cantilever beam 28 for substantially in excess of ten million switching cycles. The maximum thickness of the insulative layer 28 is preferably in the range of between 0.5 and 2 microns depending on the parameters desired for a specific application.

Figure 2:
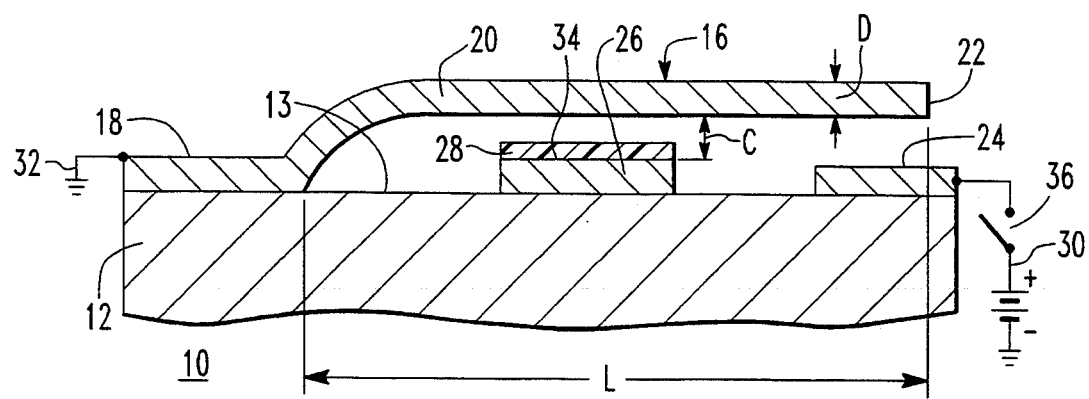
FIG. 2 is a highly magnified fragmentary longitudinal view in elevation of the embodiment of FIG. 1 showing the switch in the open position.
Figure 3:
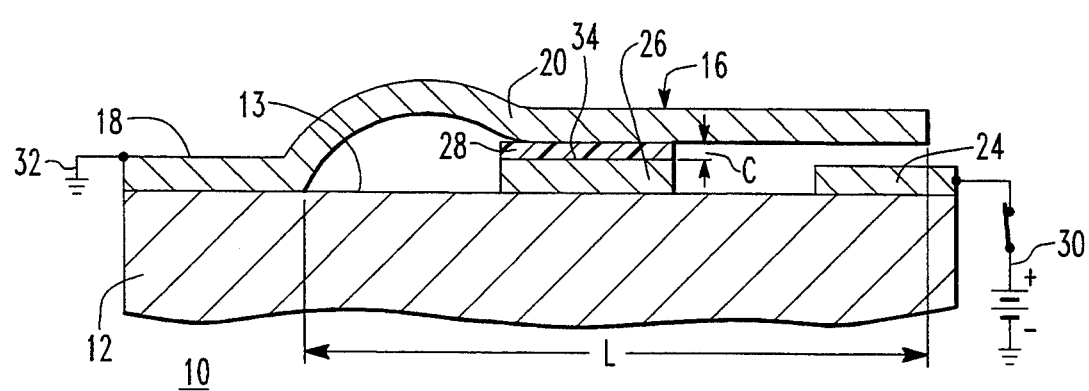
FIG. 3 is a fragmentary view similar to FIG. 2 with the switch in the closed position.

In one exemplary implementation of the electrostatic switch of FIGS. 1-3, the contact pad 26 is assumed to have a dimension opposing the surface of the cantilever beam of ten microns by ten microns, which provides an area of insulative layer 28 of one hundred square microns. The thickness of the insulative layer 28 is within the above minimum range, and there is a space of one to twenty-five microns between the layer 28 and the opposing surface of the cantilever beam. The unsupported length L of the cantilever beam 16 is in the range of between one and two mils, a thickness D for the unsupported portion 20 of one micron, and a width W of ten microns.

With a switch having the dimension as above set forth the RF current density with the switch in the closed position can be as high as 100,000 or more amperes per square centimeter, which metal migration effects may occur. Thus, without the benefit of the present invention, this metal migration resulted in the sticking of the metal cantilever to the metal pad.

As shown in FIG. 3, the microelectrostatic switch of the present invention does not have metal to metal contact in the closed position, thus, eliminating metal migration and the resultant, sticking of the cantilever beam in the closed position. As shown in FIGS. 2 and 3, the microelectrostatic switch of the embodiment of FIG. 1 has a capacitance between the opposing surfaces of the contact pad and the cantilever beam in the closed position of 0.8 Pf, and in the open position a capacitance of 0.001 to 0.01 Pf including stray capacitance. This would provide a series resistance at the point of contact of approximately 0.2 of an ohm, which will provide a switching cut off frequency of about $10^{12}$ Hz.

Thus, the non-contact closed position of the switch as shown in FIG. 3 would be suitable for long usage applications where the switching times would not be less than one nanosecond depending on the metal of the cantilever. The driver power for pulling down the cantilever beam 16 is virtually zero since the cantilever beam has no final metal to metal contact area when the switch is closed. When the switch is in the open position as shown in FIG. 2, the cantilever beam 16 is not necessarily precisely parallel to the surface of the contact pad 26. However, in the closed position, the insulated surface 28 and the opposing surface of the cantilever beam 16 are in physical engagement with each other providing exact parallelism between the surfaces provided by the uniformity of the impermeable oxide layer 28. The parallelism of the gap in the closed position, which is obtained by complete contact of the opposing surfaces and uniformity in the thickness of the layer permits the large ratio of capacitance/closed to capacitance/open, feasible. The uniform insulative layer 28 may be deposited on the contact pad in any well known manner.

Having described the presently preferred embodiment of the invention, additional advantages and modifications will readily occur to those skilled in the art. Specifically, although exemplary materials are set forth herein, the substrate, layers, cantilever beam and contact pad may be made of any material that is suitable for a microelectrostatic switch that is structurally and operatively similar to those described or referenced herein. Accordingly, the invention in its broader aspects is not limited to specific details, representative apparatus, and illustrative examples shown and described. Departure may be made from such details without departing the spirit or scope of the general inventive concept as defined by the appended claims and their equivalents.

I claim:

1. A microelectronic cantilever switch, comprising a substrate;
   a conductive cantilever beam fixed at one end to the substrate and having an elongate unsupported portion overhanging the substrate, said unsupported portion terminating at a free end;
   a pull down electrode, attached through a switch to a voltage source, for attracting the cantilever beam toward the substrate, and fixed to the substrate between the substrate and the cantilever beam;
   a metallic contact pad fixed to the substrate between the substrate and the cantilever beam, the cantilever beam being spaced from the contact pad when the switch is in the open position; and
   an insulative layer deposited on an opposing surface of one of the cantilever beam and contact pad, the cantilever beam being in engagement with the insulative layer when the switch is in the closed position.

2. The switch of claim 1 wherein opposing surfaces of the cantilever beam and the contact pad are parallel to one another at times when the switch is in the closed position.

3. The switch of claim 2 wherein the insulative layer is deposited on the surface of the contact pad.

4. The switch of claim 2 wherein the insulative layer is an impermeable oxide surface.

5. The switch of claim 1 wherein the space between an opposing surface of the overhanging free end and the insulative layer in the open position is in the range of between one and twenty-five microns.

6. The switch of claim 1 wherein the insulative layer is approximately in the range of 0.1 to 2 microns thick.

7. The switch of claim 4 wherein the insulative layer is an alumina layer.

8. The switch of claim 4 wherein the insulative layer is a material selected from one of the group consisting of aluminum and chrome.

9. The switch of claim 1 wherein the unsupported portion of cantilever beam is in the ranges of one to two mils long, one to five microns thick and five to ten microns wide, and opposing surfaces of the beam and insulated contact pad are each approximately ten by ten microns square.

* * * * *